United States Patent [19]

Hsue et al.

[11] Patent Number: 5,418,175
[45] Date of Patent: May 23, 1995

[54] PROCESS FOR FLAT-CELL MASK ROM INTEGRATED CIRCUIT

[75] Inventors: Chen-Chiu Hsue; Gary Hong, both of Hsin-Chu, Taiwan, Prov. of China

[73] Assignee: United Microelectronics Corporation, Hsinchu, Taiwan, Prov. of China

[21] Appl. No.: 239,366

[22] Filed: May 6, 1994

[51] Int. Cl.6 .................................. H01L 21/8246
[52] U.S. Cl. ..................... 437/48; 437/195; 437/984
[58] Field of Search ............ 437/43, 44, 48, 195, 437/984

[56] References Cited

U.S. PATENT DOCUMENTS

| | | | |
|---|---|---|---|
| 4,400,865 | 8/1983 | Goth et al. | 437/69 |
| 4,879,254 | 11/1989 | Tsuzuki et al. | 437/41 |
| 5,156,990 | 10/1992 | Mitchell | 437/48 |
| 5,216,270 | 6/1993 | Kaya et al. | 437/48 |
| 5,236,853 | 8/1993 | Hsue | 437/48 |
| 5,308,777 | 5/1994 | Hong | 437/44 |

*Primary Examiner*—Chandra Chaudhari
*Attorney, Agent, or Firm*—George O. Saile; Graham S. Jones, II

[57] ABSTRACT

A semiconductor device manufactured by the process including a semiconductor substrate, which comprises the steps of forming buried bit lines below the surface of said semiconductor substrate forming an individual source and drain regions; forming a gate oxide layer on the surface of the substrate; forming a first conductive structure on the gate oxide layer; forming an insulating structure in contact with the first conductive structure; removing material from the surface of the first conductive structure to expose at least a portion of the surface beneath the first conductive structure; and forming on the remaining structure on the semiconductor substrate metal line structures having edges vertically aligned with and above the source and drain regions in the buried bit lines; whereby a compound conductive structure is provided on the semiconductor substrate.

10 Claims, 4 Drawing Sheets

PROCESS FOR FLAT-CELL MASK ROM INTEGRATED CIRCUIT

BACKGROUND OF THE INVENTION

1. Field of the Invention

This invention relates to semiconductor devices and more particularly to an improved conductor structure.

2. Description of Related Art

U.S. application Ser. No. 08/098,044 filed Jul. 28, 1993 of G. Hong for "An Improved Mask ROM Process" now U.S. Pat. No. 5,308,777 describes a semiconductor device and a method of manufacturing a semiconductor device including forming a first conductivity type layer on one surface of a work piece comprising a semiconductor substrate. Then a gate oxide is formed on the surface of the substrate; a first conductive structure is formed on the gate oxide consisting essentially of polysilicon; an insulating structure is formed in contact with the first conductive structure; and then material is removed from the surface of the first conductive structure to expose at least a portion of the surface of the first layer, and to form on the remaining structure on the work piece a second conductive structure consisting essentially of polysilicon. The polysilicon is in electrical contact with the first conductive structure. Thus, a compound conductive structure is provided on the work piece.

A buried bit line ROM cell is by far the most competitive ROM structure of high density ROM memories because it is contactless and hence the cell size is smaller. The dimension of a cell is determined mainly by the pitches of the word line polysilicon structures employed to connect to the cells and the buried N+ bit lines. When the cell dimension shrinks, the buried bit line N+ doping needs to be reduced to avoid the problem of short channel punch through.

A device made with the low N+ concentration produced by the reduced level of doping is sensitive to the counter doping from P- type (boron) doping for programming in the channel region.

The boron implantation with a dose $>1\times10E14$ cm$^2$ in the channel area for programming also goes into the source/drain buried N+ area with an As+implantation dose of about $1\times10E15$ cm$^2$, which increases source/drain capacitance. Low buried bit line resistance is important because every cell will have a different bit line resistance to metal pick up contact (low resistance metallic line in contact with the contact opening.) For example, there will be one contact for every 32 cells.

An object of this invention is to make the ROM code implantation (boron for this case) into the center part of the channel area, which can achieve the goals of enhancing programming (turning the transistor off) and preventing the P+layer from encroaching upon or contacting with the N+ source/drain junction.

The problem solved by this invention is that in combination with post-metal-programming ROM process, ROM cells with high junction breakdown voltage, low junction capacitance and low buried N+ resistance for ROM product application which require higher breakdown voltage and higher speed circuits. The process is to implant programming P type boron ions into part of the channel region to turn the cell off and the boron ion implanted will not contact buried N+ drain/source regions.

SUMMARY OF THE INVENTION

A semiconductor device manufactured by the process including a semiconductor substrate, which comprises the steps of forming buried bit lines below the surface of said semiconductor substrate forming source and drain regions; forming a gate oxide layer on the surface of the substrate; forming a first conductive structure on the gate oxide layer; forming an insulating structure in contact with the first conductive structure; removing material from the surface of the first conductive structure to expose at least a portion of the surface beneath the first conductive structure; and forming on the remaining structure on the work piece a metallic structure having an edge juxtaposed with the source and drain regions in the buried bit lines; whereby a compound conductive structure is provided on the work piece.

Preferably, the first conductive structure consists essentially of polysilicon; the first conductive structure is patterned into segments; the insulating structure is formed between the segments; and the metallic structure is deposited over the top of the first conductive structure and the insulating structure.

In other aspects of the invention it is preferred that the first conductive structure is patterned into segments; the insulating structure is formed between the segments; and the second structure is deposited over the top of the first conductive structure and the insulating structure; a sidewall structure is formed adjacent to the metallic structure; the sidewall comprises a nitride spacer; preferably, including the steps as follows: patterning the conductive structure into segments; and forming a source drain oxide structure over the buried bit lines. Preferably, the insulating structure is composed of BPSG.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

Figure 1:
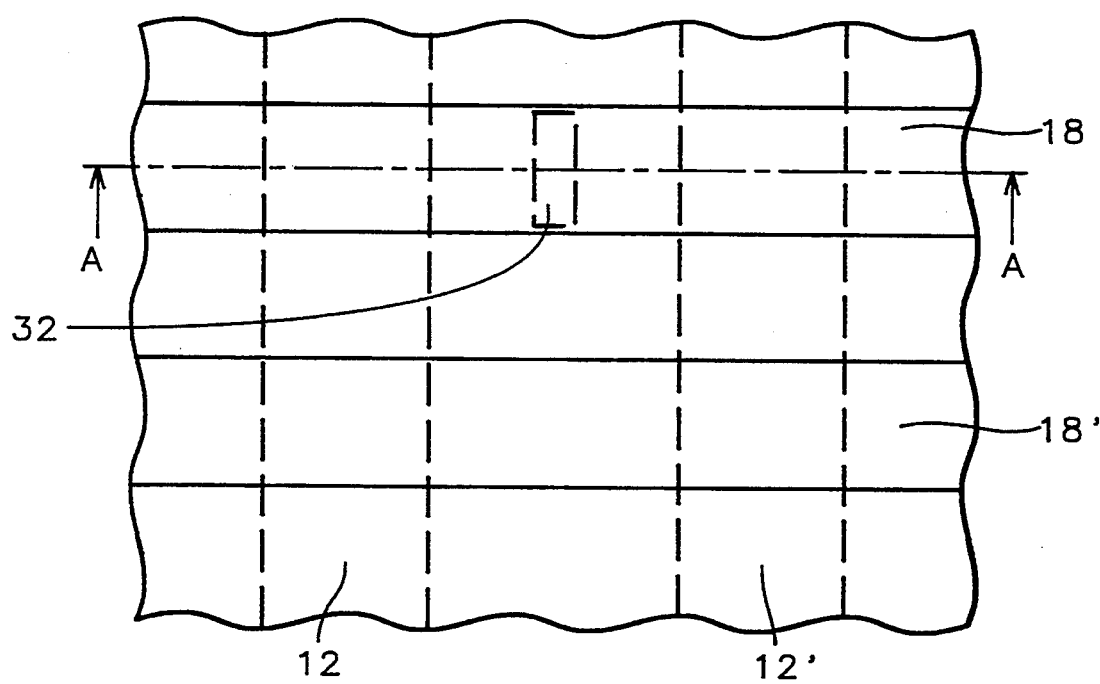
FIG. 1 shows a plan view of a semiconductor device in accordance with this invention.
Figure 2:
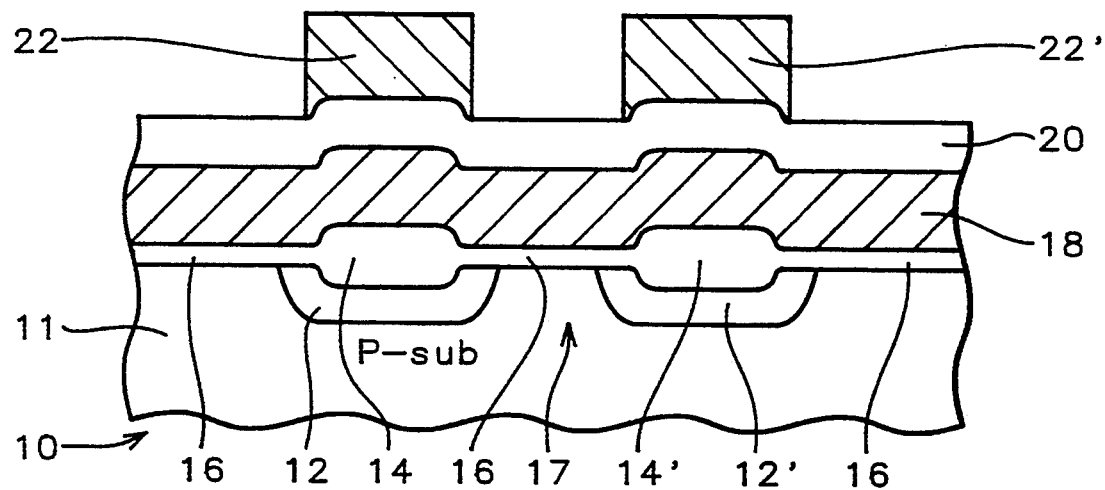
FIG. 2 shows a sectional view of that device taken along line A—A in FIG. 1.

FIG. 1 shows a plan view of a semiconductor device and FIG. 2 shows a sectional view of that device taken along line A—A in FIG. 1. Referring to FIG. 2, buried bit lines 12 and 12' are formed in the semiconductor substrate 11. The bit lines 12 and 12' are shown in phantom in FIG. 12. Word lines 18 and 18', which are formed of polysilicon or polycide, extend at right angles to bit lines 12 and 12'. For a certain design rule, the minimal opening for ROM code implantation is the same as channel area between buried bit lines 12 and 12' in the semiconductor substrate 11 shown in FIGS. 1 and 2. The polysilicon 1 layer 18 is doped with phosphorous.

FIG. 2 is a cross section taken along line A—A in FIG. 1, along the direction of word line 18. FIG. 2 shows the word line 18 crossing over the gate oxide layer 16 and SDOX (Source/Drain Oxide) structures layer 14 and 14', among others. During the gate oxide oxidation process to form gate oxide layer 16, the SDOX structures 14 and 14' were grown over the regions of an N+ implant comprising bit lines 12 and 12'. The SDOX structures 14 and 14' are thicker (from about 600 A to about 1500 A) than the gate oxide (about 200 A.) Thus, as shown, the bit lines 14, 14' (source/-drain), which are doped with N+ ions, lie beneath the SDOX layer 12. The channel area 17 comprises the region between the bit lines 12 and 12' beneath gate oxide layer 16 in the P- sub area. The source and the drain regions, which are formed by bit lines 12 and 12', are interchangeable.

Referring to FIG. 2 P-sub region 11 (p well) in a semiconductor substrate was formed by the conventional process of diffusion of boron (B) dopant and drive-in at the implantation dose level of from about $5 \times 10E11$ cm$^2$ to about $5 \times 10E12$ cm$^2$.

To form buried bit lines 12 and 12' an ion implant of buried arsenic (As) N+ ions was formed by using photoresist formed into a mask into bit line regions 12 and 12' in P-sub 11. The chemical species of the arsenic dopant is implanted with a dose of from about $1 \times 10E15$ cm$^2$ to about $3 \times 10E15$ cm$^2$, preferably less than or equal to $3 \times 10E15$ cm$^2$. It is implanted at an energy of from about 50 keV to about 100 keV in a high current implanter type of tool.

The gate oxide layer 16 having a thickness of about 150 A, was formed by the process of dry oxidation at about 900° C. or a well-known conventional method, and the thicker set of SDOX silicon dioxide structures 14 and 14' were formed over bit line regions 12, 12' between regions of gate oxide layer 16. The SDOX structures 14, 14' become thicker than the gate oxide, because the N+ region grow thicker oxide thermally. Structures 14 and 14', which are grown at the same time when the gate oxide 16 is formed, have in turn been coated with a polysilicon 1 layer 18 formed to a thickness of about 500Å using a conventional method such as LPCVD. The device with polysilicon 1 layer 18 was patterned into parallel stripes forming word lines 18, 18', as is well known in the art. Thus, the polysilicon 1 word lines 18, 18' are shaped as long, parallel lines.

Next, a BPSG layer 20 with a thickness of from about 4000Å to about 8000Å is formed by the process of LPCVD (Low Pressure CVD) or APCVD (Air Pressure CVD) process at a temperature of from about 300° C. to about 500° C. As is usual, preferably the BPSG is subjected to a "flow" process to smooth the surface of the the BPSG layer.

Before the metallization process which follows, the contact mask and etching are done to prepare for the metallization, as will be well understood by those skilled in the art. Subsequently, metal line structures 22 and 22' are formed above the bit lines 12 and 12', so that the edges of the metal line structures are vertically aligned above the bit lines, and SDOX silicon dioxide structures 14 and 14'. The metal structures 14 and 14' are formed by means of a conventional metal deposition process. The metal line structures 22 and 22' provide regular metal lines for interconnections. This process uses the metal lines 22 and 22' as implant masks that can avoid the ROM code implant into the N+ S/D region. However, this metal is used for regular interconnection for the integrated circuit. Therefore, we do not have to increase the additional process to achieve the purpose except for the optional silicon nitride Si$_3$N$_4$ spacer layer 24 described below. The etching process employed is conventional dry etching.

Figure 3A:
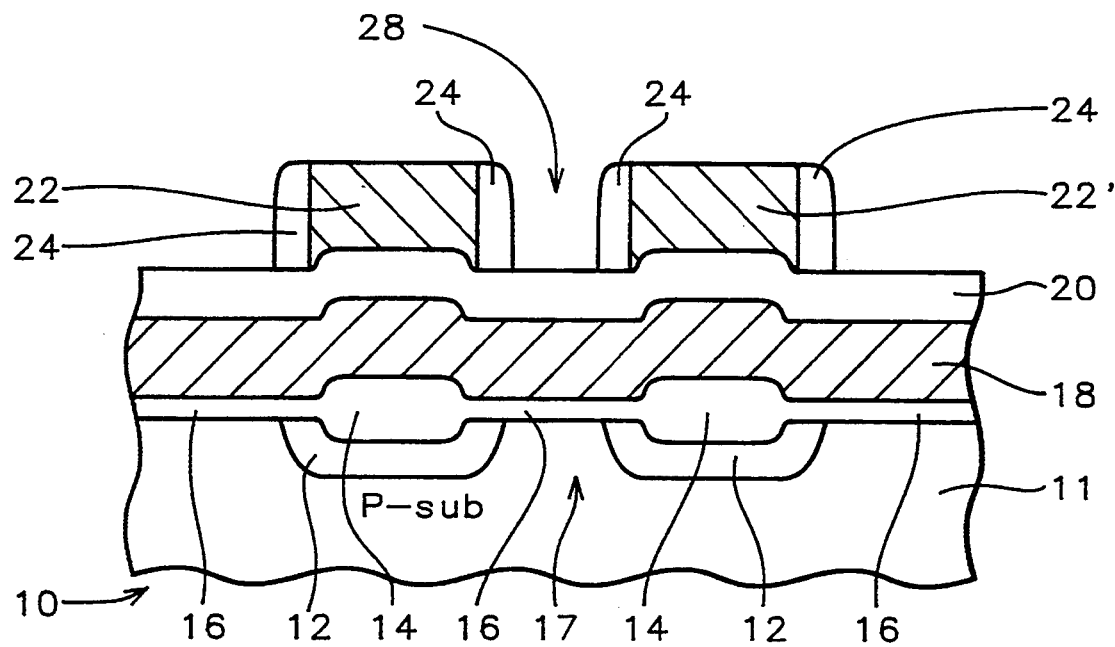
FIG. 3A shows the product of FIG. 2, after spacers structures have been formed and the photoresist mask has been removed in the conventional way.

FIG. 3A shows the product of FIG. 2, after spacers structures 24 and 24' have been formed and the photoresist mask has been removed in the conventional way.

Then an optional silicon nitride Si$_3$N$_4$ spacer layer 24 is formed over the device 10 using the conventional LPCVD process of nitride deposition and followed by an etch back process employing a conventional anisotropic dry etching process leaving the spacers 24 adjacent to the metal structures 22, 22' following the etch back.

This process when employed with the nitride spacers 24 shown in FIG. 3A produces a structure with a narrow aperture 28 through which code implanting is to be performed.

Figure 3B:
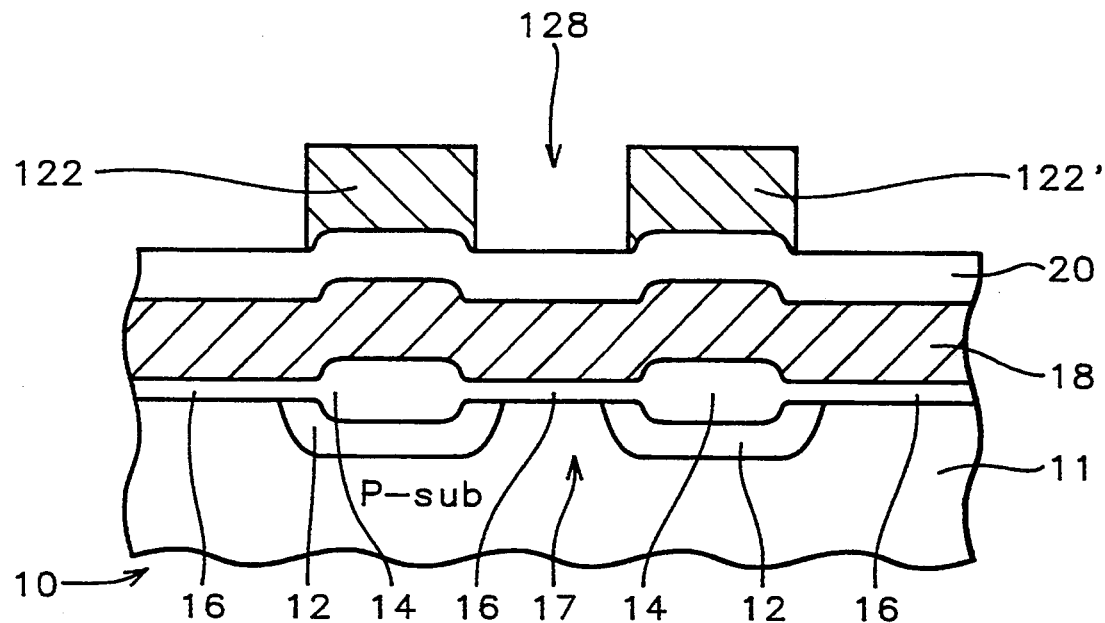
FIG. 3B shows a modification of the product of FIG. 2, with no nitride spacers having wider metal lines.

FIG. 3B shows a modification of the product of FIG. 2, with no nitride spacers having wider metal lines. If no nitride spacers 24 are used, wider metal line 122 and 122' as shown in FIG. 3B can be used. To achieve the same result without spacers, one can use such wider metal lines 122 and 122' where the metal width is wider than the buried N+ line width.

Referring to FIG. 3B, where the metal 122 and 122' narrows the code implant aperture 128 to a degree producing a structure with a narrow enough aperture 128 through which code implanting is performed approximating a sufficient amount. Accordingly, if the metal structures 122 and 122' are close enough, the nitride spacers 24 of FIG. 3A are optional, as shown in FIG. 3B.

Figure 4A:
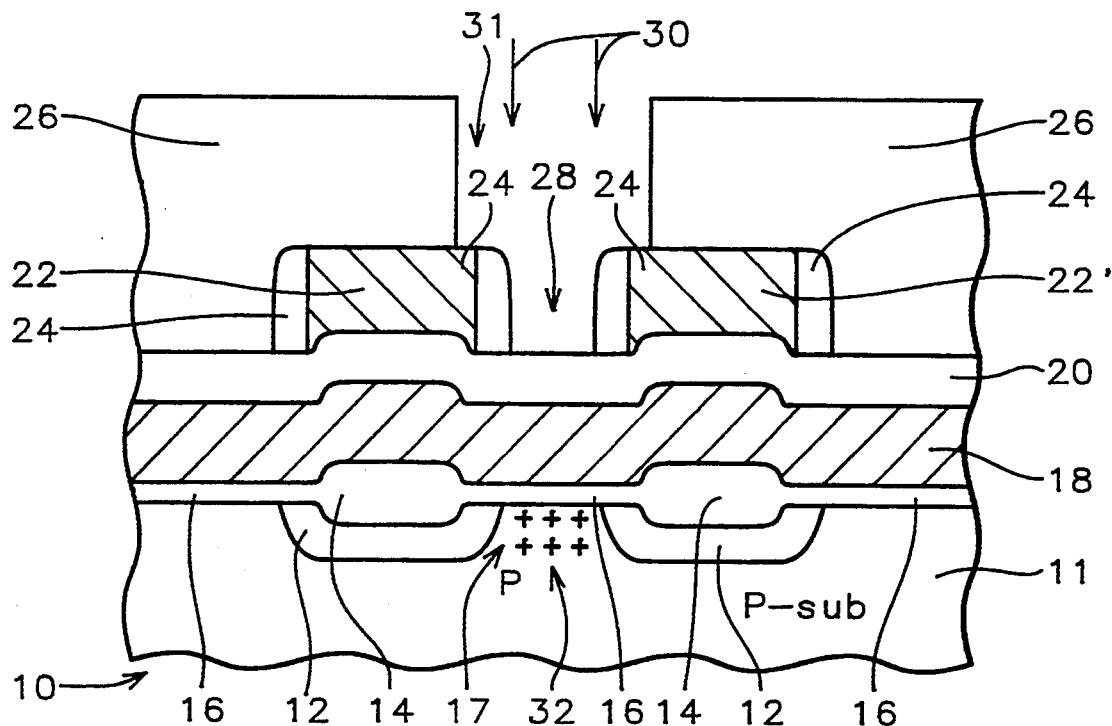
FIG. 4A which shows the product of FIG. 3A after a photoresist mask has been formed.

FIG. 4A which shows the product of FIG. 3A after a photoresist mask has been formed.

Referring to FIG. 4A which shows the product of FIG. 3A, in the next step of the process above the BPSG layer 20, the metal structures 22 and 22', and the spacers 24, a photoresist layer 26 is formed.

By combining the nitride spacers 24 and the metal structures 22, a self aligned smaller ROM code opening 28 is provided for implanting of boron.

The photoresist layer 26 is formed into a mask with an opening 31 down to aperture 28 above the channel 17. An ion implant 30 of boron B+ions is implanted into the opening 28. The chemical species of the dopant implanted is boron with a dose of from about $7 \times 10E13$ cm$^2$ to about $2 \times 10E14$ cm$^2$, at an energy of about 100 keV.

At the end of the ion implantation of ions 30, the resist layer 26 is removed.

Figure 4B:
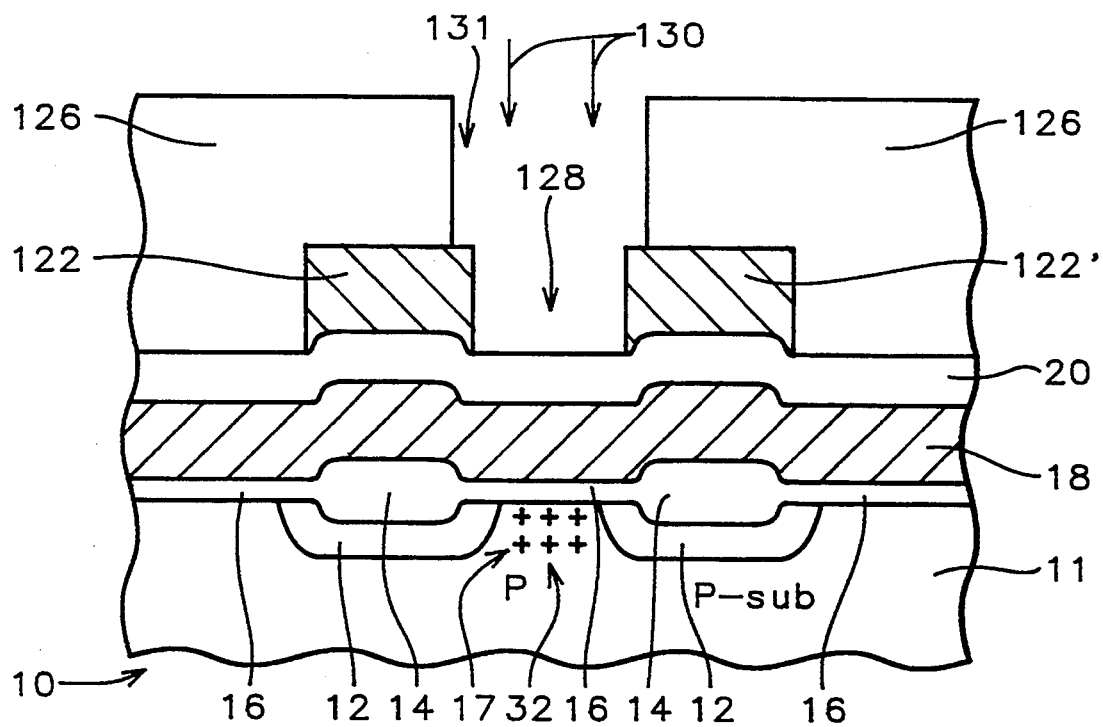
FIG. 4B which shows the product of FIG. 3B after a photoresist mask has been formed.

FIG. 4B which shows the product of FIG. 3B after a photoresist mask has been formed.

Referring to FIG. 4B, above the BPSG layer 20 and metal structures 122 and 122', a photoresist layer 126' is formed.

With the metal structures 122 and 122', a self aligned smaller ROM code opening 128 is provided for implanting of boron.

The photoresist 126 is formed into a mask with an opening 131 down to aperture 128 above the channel 17. An ion implant 130 of boron B+ions is implanted into the opening 128. The chemical species of the dopant implanted is boron with a dose of from about $7 \times 10E13$ cm$^2$ to about $2 \times 10E14$ cm$^2$, at an energy of about 100 keV.

At the end of the implantation of ions 130, the resist layer 126 is removed.

Figure 5:
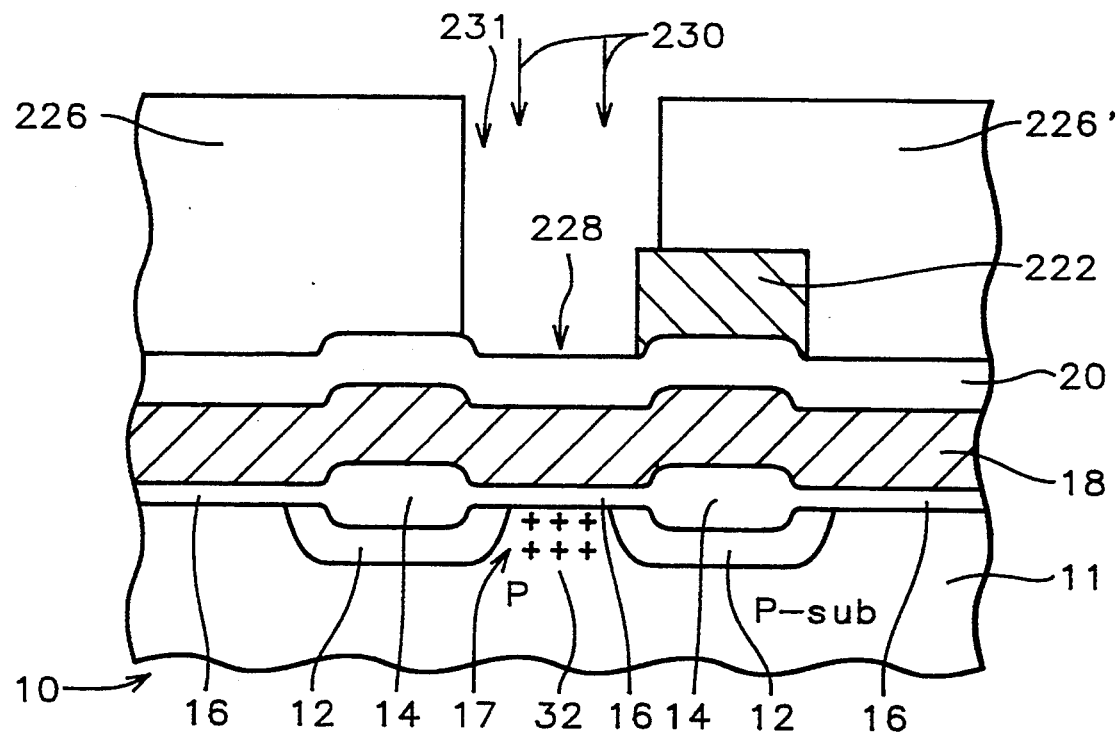
FIG. 5 shows an alternative embodiment with only one metal structure.

FIG. 5 shows an alternative embodiment with only one metal structure 222. This embodiment is predicated upon the design of a buried bit-line ROM using a structure with non-interchangeable drain/source regions. Accordingly only one metal structure 222 is required per two buried N+ bit lines. The width of metal structure 222 can be increased to cover the drain side of the memory cell to achieve higher drain junction breakdown voltage.

After metal structure 222 has been formed, the photoresist mask used to form structure 222 is removed in the conventional way from the BPSG layer 20

No optional silicon nitride Si$_3$N$_4$ spacer layer is formed over the device.

This process when employed with the metal structure covering the drain size of the memory cell to achieve a higher drain junction breakdown voltage shown in produces a structure with a narrow aperture 228 through which code implanting is to be performed.

Where the metal 222 narrows the code implant aperture 228 to a degree producing a structure with a narrow enough aperture 228 through which code implanting is performed approximating a sufficient amount.

Referring to FIG. 5, above the BPSG layer 20 and the metal structures 222 a photoresist layer 226 is formed, leaving a self-aligned ROM code opening 28 for implanting of boron.

The photoresist layer 226 is formed into a mask with an opening 231 down to aperture 228 above the channel 17'. An ion implant 230 of boron B+ ions is implanted into the opening 228. The chemical species of the dopant implanted is boron with a dose of from about $7 \times 10E13$ cm$^2$ to about $2 \times 10E14$ cm$^2$, at an energy of about 100 keV.

At the end of the ion implantation of ions 230, the resist layer 226 is removed.

In this case only the wider metal line 222 which is used to cover part of the channel near the drain side is needed. No metal spacer is utilized.

The advantage of FIG. 4 is that there is a high Junction breakdown voltage with just one metal structure.

Another advantage is low bit-line resistance.

There is also low junction capacitance as seen in FIGS. 3A and 3B. When implanted boron (P-type dose) contact N+ (S/D) the N+ /P+ junction capacitance will increase.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a semiconductor device including a semiconductor substrate, which comprises the steps of
   (a) forming buried bit lines below the surface of said semiconductor substrate forming individual source and individual drain regions,
   (b) forming a gate oxide layer on the surface of said substrate,
   (c) forming a first conductive structure on said gate oxide layer,
   (d) forming an insulating structure in contact with said first conductive structure,
   (e) etching said insulating structure and etching said first conductive structure to expose at least a portion of the surface beneath said first conductive structure to prepare for metallization, and
   (f) forming on the remaining structure on said semiconductor substrate metal line structures having edges vertically aligned with and above said individual source and individual drain regions in said buried bit lines,
whereby a compound conductive structure is provided on said semiconductor substrate.

2. The method of claim 1 wherein said first conductive structure consists essentially of polysilicon.

3. The method of claim 1 wherein said first conductive structure is patterned into segments, said insulating structure is formed between said segments, and said metal line structures are formed over the top of said first conductive structure and said insulating structure.

4. The method of claim 2 wherein said first conductive structure is patterned into segments, said insulating structure is formed between said segments, and said metal line structures are formed over the top of said first conductive structure and said insulating structure.

5. The method of claim 4 wherein a sidewall structure is formed adjacent to said metal line structures.

6. The method of claim 5 wherein said sidewall comprises a nitride spacer.

7. The method of claim 1 wherein including the steps as follows:
   a) patterning said first conductive structure into segments, and
   b) forming a source drain oxide structure over said buried bit lines.

8. The method of claim 1 wherein said insulating structure is composed of BPSG.

9. The method of claim 7 wherein said insulating structure is composed of BPSG.

10. The method of claim 6 wherein said insulating structure is composed of BPSG.

* * * * *